United States Patent
Lu et al.

(10) Patent No.: US 8,248,883 B1
(45) Date of Patent: Aug. 21, 2012

(54) NON-VOLATILE I/O DEVICE BASED MEMORY

(75) Inventors: Ting Lu, Austin, TX (US); Kam-Wing Li, Cupertino, CA (US); Anatoly Belkin, Glenview, IL (US); Ahmad R. Ansari, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 193 days.

(21) Appl. No.: 12/873,041

(22) Filed: Aug. 31, 2010

(51) Int. Cl.
*G11C 8/00* (2006.01)
(52) U.S. Cl. .............................. 365/230.06; 365/230.01
(58) Field of Classification Search ............. 365/230.06, 365/230.01
See application file for complete search history.

(56) References Cited

U.S. PATENT DOCUMENTS

| | | | | |
|---|---|---|---|---|
| 5,778,413 A * | 7/1998 | Stevens et al. | ........... | 365/189.15 |
| 7,911,871 B2 * | 3/2011 | Hidaka | ................. | 365/230.03 |
| 2005/0162929 A1 * | 7/2005 | Shiota et al. | ............ | 365/185.29 |
| 2007/0091707 A1 * | 4/2007 | Hidaka | ................. | 365/230.03 |
| 2009/0316499 A1 * | 12/2009 | Hidaka | ................. | 365/189.011 |

OTHER PUBLICATIONS

Taylor, Brad and Wittig, Ralph, "28nm Generation Programmable Families", 7 Series FPGAs, Extensible Processing Platform Family, AMBA AX14 IP, Aug. 8, 2010, pp. 1-25, Xilinx, 2100 Logic Drive, San Jose, CA 95124.
Nass, Rich, "Xilinx puts ARM Core into its FPGAs", EE Times, 2 pp., Apr. 27, 2010, available at http://www.eetimes.com/electronics-products/processors/4115523/Xilinx-puts-ARM-core-into-its-FPGA.

* cited by examiner

*Primary Examiner* — Tuan T. Nguyen
(74) *Attorney, Agent, or Firm* — Kevin T. Cuenot

(57) ABSTRACT

A system for implementing a non-volatile input/output (I/O) device based memory can include an interface configured to receive a processor request specifying a data unit. The data unit can be specified by a processor address. The system can include an address-data converter coupled to the interface. The address-data converter can be configured to correlate the processor address of the data unit to a data block within the non-volatile I/O device. The system further can include an I/O controller coupled to the address-data converter. The I/O controller can be configured to issue a non-volatile I/O device command specifying the data block to the non-volatile I/O device.

20 Claims, 3 Drawing Sheets

NON-VOLATILE I/O DEVICE BASED MEMORY

FIELD OF THE INVENTION

One or more embodiments disclosed within this specification relate to integrated circuits (ICs). More particularly, one or more embodiments relate to a random access memory implemented using a non-volatile input/output device.

BACKGROUND

Programmable integrated circuits (ICs) are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Programmable ICs are often incorporated into larger systems that include, for example, a processor. In some cases, the processor can be implemented as a functional block within the programmable IC. Processors operate through execution of program code stored within a memory. The memory is typically implemented as a random access memory (RAM). The RAM allows the processor to access particular words, bytes, and/or bits of data stored therein. As systems become more complex, an increased quantity of memory often is required to store program code for the processor. Increased memory requirements typically translate into increased costs for implementing the system.

Other memory technologies that are less expensive than RAM, e.g., non-volatile I/O devices, lack features necessary to support execution of program code. For example, flash memory, one type of non-volatile I/O device, is only able to address an entire data block at any given time. Read and/or write operations directed to I/O devices such as, for example, serial peripheral interface (SPI) flash, queued serial peripheral interface (QSPI) flash, serial advanced technology attachment (SATA) flash, and NAND flash memories, are typically executed upon a data block of a predetermined and unchanging size irrespective of the operation being performed or the size of data affected by the operation. The data block is typically an address range formed of hundreds or thousands of bytes. For example, a read operation reads one or more data blocks from the flash memory. A write operation writes one or more data blocks to the flash memory. Flash memory lacks the ability to access specific locations in memory such as a word, a byte, or a particular bit, as is possible with RAM. As such, random access of data, e.g., such as a bit, a byte, or a word, from SPI, QSPI, SATA, or NAND flash memories is not possible since these devices operate only upon entire data blocks at any given time. This makes flash memory unsuitable for use as execution memory in processor based systems.

SUMMARY

One or more embodiments disclosed within this specification relate to integrated circuits (ICs) and, more particularly, to a system for implementing a non-volatile input/output (I/O) device (I/O device) based memory. One or more embodiments of the system having an interface configured to receive a processor request specifying a data unit. The data unit can be specified using a processor address. The system further can include an address-data converter coupled to the interface. The address-data converter can be configured to correlate the processor address of the data unit to a data block within the I/O device. The system can include an I/O controller coupled to the address-data converter. The I/O controller can be configured to issue a non-volatile I/O device command specifying the data block to the I/O device.

One or more other embodiments can include a method of using an I/O device with a processor. The method can include receiving a read request specifying a data unit. The data unit can be specified using a processor address. The method further can include correlating the processor address of the data unit to a data block stored within the I/O device and retrieving the data block from the I/O device. Data from the data block that correlates to the data unit can be extracted. The extracted data can be returned to the processor as the data unit.

One or more other embodiments can include a method of using an I/O device with a processor. The method can include receiving, from a processor, a write request specifying a data unit to be written to the I/O device. The data unit can be specified using a processor address. The method further can include correlating the processor address to a data block stored within the I/O device and retrieving the data block from the I/O device. The data block can be updated with the data unit specified by the write request. The updated data block can be written to the I/O device.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to implementing a random access memory (RAM) using a non-volatile input/output (I/O) device. In accordance with the one or more embodiments disclosed within this specification, random access to a non-volatile I/O device can be facilitated through a controller. Read and write operations can be performed upon data units that are smaller in size than the data blocks supported by conventional non-volatile I/O devices. By facilitating greater granularity with regard to data access, a non-volatile I/O device can be used as a RAM to store program code that can be executed by a processor. The one or more embodiments disclosed within this specification allow a non-volatile I/O device to be used as a lower cost replacement for RAM technologies such as, for example, single data rate (SDR) and double data rate (DDR) RAM.

Figure 1:
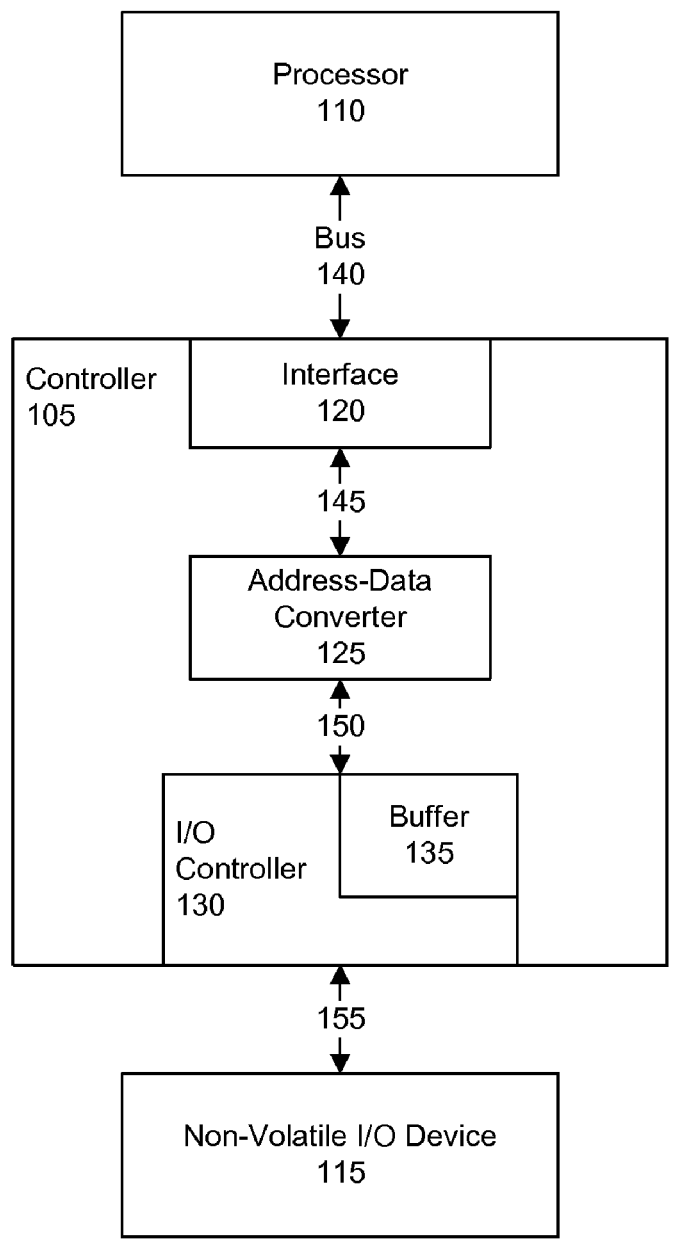
FIG. 1 is a block diagram illustrating a system for implementing non-volatile I/O device based random access memory in accordance with one or more embodiments disclosed within this specification.

FIG. 1 is a block diagram illustrating a system 100 for implementing non-volatile I/O device based RAM in accordance with one or more embodiments disclosed within this specification. System 100 facilitates the use of a non-volatile I/O device such as a RAM. As pictured in FIG. 1, system 100 can include a controller 105, a processor 110, and a non-volatile I/O device (I/O device) 115.

Processor 110 can represent one or more processor(s) coupled to controller 105. In one or more embodiments, program code that is to be executed by processor 110 can be stored within I/O device 115. Processor 110 can access program code stored within I/O device 115 via controller 105. In one or more embodiments, processor 110 can be implemented as a central processing unit (CPU). Processor 110 can be implemented as a hard processor, e.g., dedicated circuitry, or as a "soft" processor that is implemented using the programmable fabric of a programmable IC.

I/O device 115 can be implemented as one or more non-volatile I/O devices such as, for example, a NAND flash device, a serial peripheral interface (SPI) flash device, a queued serial peripheral interface (QSPI) flash device, serial advanced technology attachment (SATA) flash device, or the like. As noted, in one or more embodiments, I/O device 115 can store program code to be executed by processor 110 and/or data to be processed by processor 110. Unlike RAM, read operations and/or write operations are performed upon a data block stored within I/O device 115. A data block is typically much larger than the smallest addressable unit of data that can be accessed by processor 110 when an actual RAM is used to store program code.

Controller 105 facilitates two way communication between processor 110 and I/O device 115. In general, controller 105 can receive requests from processor 110, e.g., "processor requests," and send responses to the processor requests to processor 110. A processor request can specify, for example, a processor command and a processor addressable data unit (data unit) upon which the processor command is to be applied or executed. As used within this specification, the phrase "processor addressable data unit" or "data unit" can refer to a portion or quantity of data, e.g., program code or the like, that can be specified or requested by a processor such as processor 110. A data unit can be specified in terms of an address or address range using, for example, a protocol used by processor 110, e.g., a processor address, to write data to, and/or read data from, a RAM device.

As shown, controller 105 can include an interface 120, an address-data converter (converter) 125, and an input/output (I/O) controller 130. In one or more embodiments, controller 105 can be implemented within the programmable fabric of a programmable IC. It should be appreciated, however, that controller 105 can be implemented or instantiated within an IC that is programmable or an IC that is not programmable. Further, processor 110 can be implemented on the same IC within which controller 105 is implemented or within an IC that is different from the IC within which controller 105 is implemented.

As shown, controller 105 can be coupled to processor 110 through a communication bus (bus) 140. Communication bus 140 can be any of a variety of different communication buses used within processor-based systems. Interface 120 of controller 105 can be configured to communicate over bus 140 using, for example, a same communication protocol as each other device, including processor 110, that may be coupled to bus 140. For example, interface 120 can be configured to monitor for bus transactions directed to controller 105, to hold and/or take control of bus 140, and to send transactions, e.g., responses, from controller 105 to other devices over bus 140. As such, interface 120 can receive processor requests directed to controller 105 from processor 110 on bus 140 and send responses to processor 110 via bus 140 in response to the processor requests.

It should be appreciated that a communication bus is used within this specification for purposes of illustration. In one or more other embodiments, processor 110 can be coupled to interface 120 via one or more direct signal links, for example. The particular type of connection between processor 110 and controller 105 is not intended as a limitation of the one or more embodiments disclosed within this specification.

In one or more other embodiments, some portions of controller 105 and processor 110 can operate within different clock domains, e.g., two different clock domains having different operating frequencies. For example, interface 120 can be clocked according to the same operating frequency as bus 140, which can be different from the clock rate of converter 125 and/or I/O controller 130. Processor 110, being configured to communicate on bus 140, can be clocked at the same operating frequency as bus 140 and, therefore, interface 120.

Converter 125 can be coupled to interface 120 via signal 145. Accordingly, any processor requests received by interface 120 can be passed to converter 125 via signal 145 for processing. Similarly, any responses to be provided back from controller 105 to processor 110 can be sent from converter 125 to interface 120 via signal 145. Such responses can be sent to processor 110 by interface 120 over bus 140 as described.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

In general, converter 125 can translate processor requests to a format that is understandable and usable by I/O device 115. For example, I/O device 115 can be implemented with a QSPI flash device clocked by controller 105. Each data line within I/O device 115, i.e., the QSPI flash device, can be bi-directional and, as such, capable of either receiving or outputting a data block. The initiation of an exchange of data via a data line can be signaled to I/O device 115 by a change of logic state at a chip select pin. The logic state at the chip select pin can be altered by I/O controller 130 in response to commands from converter 125.

Continuing with the example of a QSPI flash device, an instruction code can be output on the data line by I/O controller 130 during the first 8 cycles of the clock responsive to commands from converter 125. The instruction code can determine the type of operation to be performed by I/O device 115. Converter 125 can command I/O controller 130 to provide addressing information, via the data line, that determines which data block, or blocks as the case may be, within I/O device 115 is to be operated upon following the instruction code. Depending upon the type of operation described by the instruction code, via the data line, a data block can be either read out of I/O device 115 or written into I/O device 115.

Converter 125 also can translate information received from I/O device 115 to a format that can be provided to processor 110 via bus 140. In one or more embodiments, converter 125 can correlate an address or address range of a data unit specified as part of the received processor request, referred to as processor specified addresses, to a memory block, or memory blocks as the case may be, within I/O device 115 that include the data unit identified by the processor specified address. For example, converter 125 can store a mapping of processor specified addresses to data blocks and data block offsets within I/O device 115 that correspond to the processor specified addresses.

In one or more other embodiments, converter 125 can correlate a processor command received as part of the processor request to one or more non-volatile I/O device commands (I/O device commands). The particular mapping of processor commands to I/O device commands will be described in greater detail within this specification.

In illustration, consider the case in which a received processor request is a read request. Converter 125 can perform translations to effectuate the read request. Converter 125 can convert the processor command, e.g., a processor read command, into an I/O device read command. Converter 125 can convert the processor specified address range of the processor read command into a particular data block or data blocks that contain the processor specified address range. Converter 125 can instruct I/O controller 130 via signal 150 to execute one or more I/O device read commands to retrieve the particular data block(s) that contain the data unit requested by processor 110 based upon the stored mapping of processor addresses to I/O device addresses.

In further illustration, consider the case in which a received processor request is a processor write request. Converter 125 can perform translations to effectuate the write request. Converter 125 can convert the processor command, e.g., a processor write command, into an I/O device read command for I/O device 115 to initially retrieve the needed data blocks. Converter 125 can convert the processor specified address range for the data unit to be written into a particular data block or data blocks that contain the processor specified data unit.

Unlike the processor read request, however, converter 125 must also effectuate a write of the retrieved data blocks. More particularly, the data block(s) that include the data unit to be written must first be retrieved, then modified within controller 105, then written back to I/O device 115. Thus, the processor write command effectively translates into an I/O device read command followed by an I/O device write command.

I/O controller 130 can be coupled to converter 125 via signal 150. Accordingly, I/O controller 130 can receive instructions to communicate with I/O device 115 via signal 150 from converter 125. I/O controller 130 can be coupled to I/O device 115 via signal 155. I/O controller 130 can be configured to communicate using the same communication protocol as I/O device 115 over signal 155.

As shown, I/O controller 130 can include buffer 135. Data block(s) received from I/O device 115 in response to an I/O device read command sent from I/O controller 130 to I/O device 115 can be stored within buffer 135. I/O controller 130, responsive to storing a data block or data blocks within buffer 135, can notify converter 125 via signal 150 of the availability of requested data within buffer 135. In one or more embodiments, buffer 135 can be implemented as a cache memory. Data blocks retrieved as part of a processor write request can be stored within buffer 135 and updated within buffer 135 by converter 125 prior to being written back to I/O device 115 by I/O controller 130.

In one or more embodiments, the different I/O device commands and corresponding I/O device addresses determined by converter 125 can be provided to I/O controller 130 via signal 150. For example, converter 125 can generate the particular I/O device commands in the correct format used to communicate with I/O device 115. In that case, I/O controller 130 can pass commands from converter 125 to I/O device 115 and await data block(s) and/or other information received from I/O device 115 in response.

In one or more other embodiments, converter 125 can send instructions to I/O controller 130 to implement an I/O device read and/or an I/O device write using an I/O device address or address range passed from converter 125. In that case, I/O controller 130, being configured to communicate using the same communication protocol as I/O device 115, can generate the particular I/O device commands needed to communicate with I/O device 115, including the generation of any control signals and/or control bits while also observing timing requirements of I/O device 115. I/O controller 130 can send the I/O device commands to I/O device 115 and receive the requested data block(s).

Further aspects of controller 105 relating to effectuating processor read requests and processor write requests are described with reference to the remaining figures within this specification.

Figure 2:
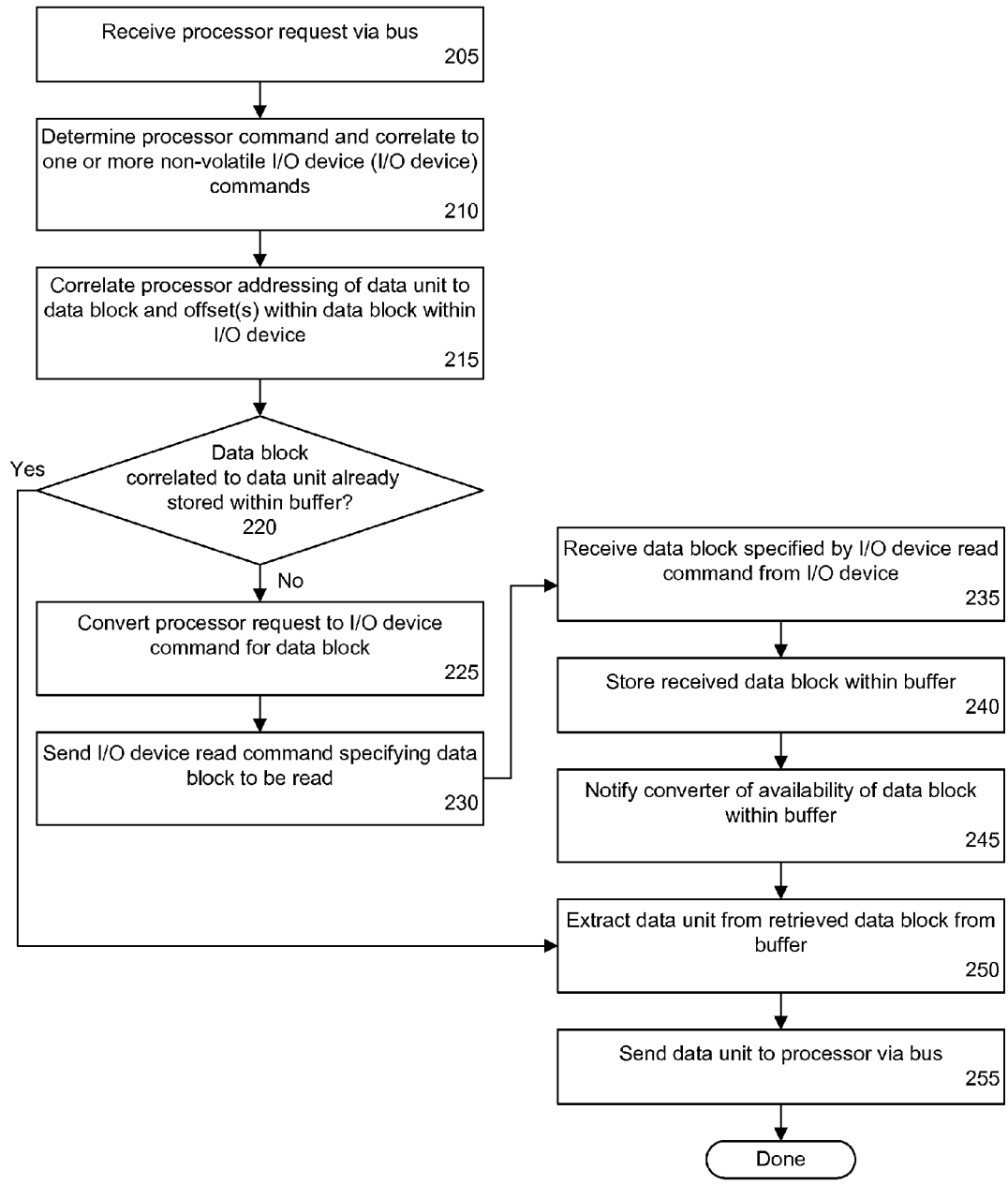
FIG. 2 is a first flow chart illustrating a method of handling a processor request using a non-volatile I/O device in accordance with one or more other embodiments disclosed within this specification.

FIG. 2 is a first flow chart illustrating a method 200 of handling a processor request using an I/O device in accordance with one or more other embodiments disclosed within this specification. Method 200 can be implemented using a system as described with reference to FIG. 1. In general, method 200 describes a method of handling a processor read request as performed by the controller illustrated with reference to FIG. 1. For purposes of illustration, method 200 is described largely in the context in which a data unit is within a single data block. Examples in which a data unit spans more than one data block are, however, described to provide a more complete description of the one or more embodiments.

Beginning in step 205, the interface of the controller can receive a processor request via a bus. In general, each processor request can specify a processor command and a data unit specified using a processor-based addressing scheme that is used to communicate with a RAM. Further, the controller can track the order in which two or more processor requests are received and follow established data coherency rules when processing the requests. The controller can assure that the order in which the processor requests are executed does not impact the integrity of the data written to the I/O device and/or returned to the processor.

For example, a processor write request for a data unit can be received by the controller subsequent to a processor read request for the same data unit. The processor read request can be for data stored within the I/O device and is to be executed prior to the processor write request that updates the data within the I/O device. In observing data coherency rules, the processor read request is executed prior to the processor write request. If the write request is executed prior to the read request, the write operation updates the data within the I/O device prior to the read request being executed. As a result, the controller returns incorrect data, i.e., the updated data, to the processor rather than the original version of the data.

In step 210, the converter can determine the processor command from the processor request. In this example, the controller, and more particularly the converter, can determine that the processor request, being a processor read request, specifies a processor read command. The converter can correlate the processor read command to one or more I/O device commands that implement the processor command. For purposes of illustration, the converter can determine that the processor read command correlates to an I/O device read command. The I/O device read command can include, for example, I/O device specific signaling as described with reference to QSPI flash devices or the like.

In step 215, the converter can correlate the processor addressing of the data unit to a particular data block within the I/O device. For example, the data unit requested by the processor can be a bit, a byte, or a word. The data block within the I/O device can be equal to approximately one kilobyte. The particular block that includes the data unit can be identified. In another example, the data unit can be two kilobytes that begins within the middle of a first data block, continues into a second consecutive data block, and ends at approximately midway through a third consecutive data block within the I/O device. The processor address range specifying the data unit can be translated into a start data block, a start index within the start data block, an ending data block, and an ending index within the ending data block. When the data unit is contained within a single data block, the start data block and the end data block can be the same data block and only a single data block need be specified.

In decision box 220, the converter can determine whether a data block currently stored within the buffer is correlated to the data unit. For example, the desired data block may be stored within the buffer in consequence of processing a previous processor request. When the data block already stored within the buffer correlates to a data unit specified by the read request, the converter can bypass the process of retrieving the data block determined in step 215 from the I/O device. Accordingly, method 200 can proceed to step 250. When the data unit is not correlated to any data block already stored within the buffer, method 200 can proceed to step 225 and begin the process of retrieving the data block determined in step 215 from the I/O device.

In step 225, the converter can convert the processor read request to an I/O device command for the data block determined in step 215. The converter, for example, can instruct the I/O controller to implement an I/O device read command for the particular data block determined in step 215. When a single data block is needed, the converter can instruct the I/O controller to implement an I/O device read command to retrieve the single data block as determined from the mapping described in step 215.

When a plurality of data block are needed, the converter can instruct the I/O controller to implement one or more I/O device read commands to retrieve each data block. For example, the I/O controller can issue a plurality of individual I/O device read commands where each I/O device read commands specifies one data block to be retrieved depending upon the capabilities of the I/O device. In another example, a list or range of data blocks can be specified through a single I/O device read command. The particular blocs to be retrieved can be determined from the mapping performed in step 215.

In step 230, the I/O controller can send the I/O device read command specifying the particular data block to be read to the I/O device. As noted, the I/O controller can generate the I/O device read command responsive to instructions and I/O device data block information received from the converter. In step 235, the I/O controller can receive the data block specified in the I/O device read command from the I/O device. In step 240, responsive to receiving the data block from the I/O device, the I/O controller can store the received data block within the buffer. In step 245, the I/O controller can notify the converter that the requested data block from the I/O device is available within the buffer.

In step 250, the converter can extract, e.g., read, the data unit specified by the processor request received in step 205 from the buffer of the I/O controller. For example, the converter can locate the start index within the start data block and read data up to the end index of the end data block. As noted, the start index of the start data block can correspond to the processor specified starting address of the data unit. The end index within the end data block can correspond to the processor specified ending address of the data unit. The start data block and the end data block can specify the same data block when a single data block is retrieved.

With certain I/O devices, data can be read out of the I/O device according to processor specified addressing. In that case, a processor specified data unit can be read directly from the I/O device and need not be read out as a data block from the I/O device. With such I/O devices, the data extraction process described in step 250 may not be required to execute the processor request. In such cases, method 200 can bypass step 250 and proceed to step 255.

In step 255, the data unit can be sent to the processor via the bus. For example, the converter can notify the interface that data requested by the processor is available for sending. Accordingly, the interface can generate a response including the data unit read from the buffer and formatted using the communication protocol of the bus. The interface can send the response including the data unit to the processor via the bus.

Figure 3:
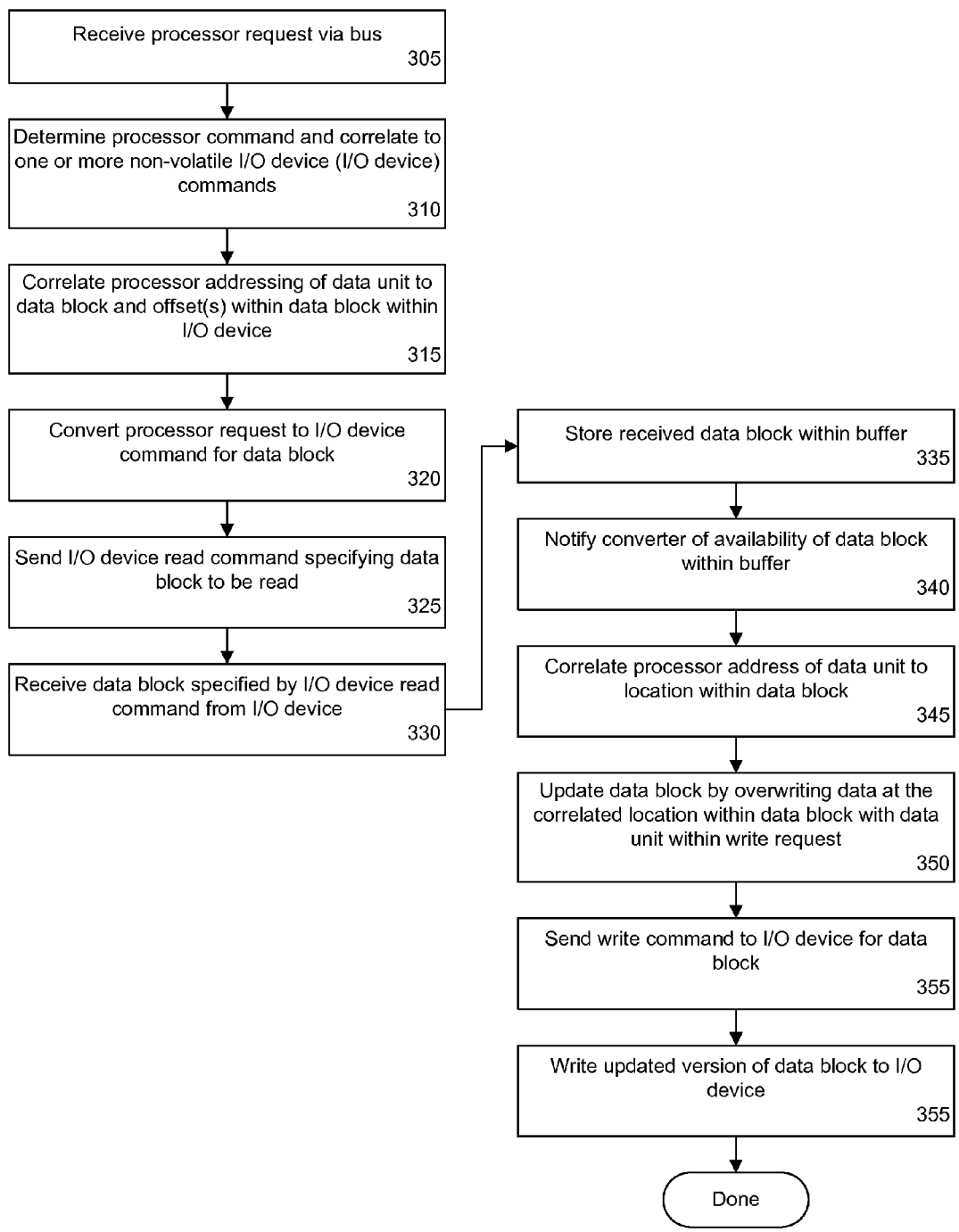
FIG. 3 is a second flow chart illustrating a method of handling a processor request using a non-volatile I/O device in accordance with one or more other embodiments disclosed within this specification.

FIG. 3 is a second flow chart illustrating a method 300 of handling a processor request using an I/O device in accordance with one or more other embodiments disclosed within this specification. Method 300 can be implemented using a system as described with reference to FIG. 1. In general, method 300 describes a method of handling a processor write request as performed by the controller illustrated with reference to FIG. 1. As noted with reference to FIG. 2, for purposes of illustration, method 300 is described largely in the context in which a data unit is within a single data block. Examples in which a data unit spans more than one data block are, however, described to provide a more complete description of the one or more embodiments.

Beginning in step 305, the interface of the controller can receive a processor request via a bus. When the processor request is a write command, in one or more embodiments, the interface can generate and/or send an acknowledgement signal to the processor that the interface has received the processor request and release control of the bus. As no data is returned from the I/O device in response to a processor write command and access times for a write operation to an I/O device are typically longer than execution times for the processor, occupying the processor during the execution of the write command can degrade processor performance. Issuing the acknowledgement to the processor request and releasing the processor to perform other operations can improve the processing efficiency of the system.

In step 310, the converter can determine the processor command from the processor request. In this example, the controller determines that the processor request, being a processor write request, specifies a processor write command for a data unit to be written to the I/O device. The controller correlates the processor write command to one or more I/O device commands that implement the processor write command. For purposes of illustration, the converter can determine that the processor write command correlates to an I/O device read command and a subsequent I/O device write command. For purposes of illustration, any signaling and/or control data that is I/O device specific and, therefore, to be provided to the I/O device can be considered part of the I/O device read command and/or I/O device write command.

In step 315, the converter can correlate the processor addressing of the data unit to a particular data block within the I/O device. As noted, the processor addressing can be correlated to a start data block, a start index within the start data block, an ending data block, and an ending index within the ending data block. In step 320, the converter can convert the processor write request to one or more I/O device commands for the data block determined in step 315. In this example, the processor write command can map to one or more I/O device read commands, one or more I/O device write commands, and/or one or more other actions by the controller depending upon the type of I/O device coupled to the controller.

Consider the case of an I/O device that is limited to processing a single data block per operation. When the controller receives a processor write command specifying a data unit mapped to two or more data blocks stored within the I/O device, the converter is constrained to processing the data unit by reading a single data block from the I/O device, updating the data block within the controller, and then writing the data back to the I/O device. The process continues iterating to process one data block at a time until the write operation is completed across each data block mapped to the data unit specified by the processor write request. With the processing of the data unit limited to single block increments, the converter must convert the processor write request to a series of single data block read and subsequent write commands in order to process the two or more data blocks mapped to the data unit. Alternatively, data blocks can be retrieved individually into the controller, updated as a group, and then written back to the I/O device individually, e.g., in series.

In one or more other embodiments, for example, where the I/O device supports the reading and/or writing of multiple data blocks, each of the plurality of data blocks that includes the data unit can be retrieved into the controller, updated as a group, and then written back to the I/O device as a group. Within each variation described, the particular I/O device read commands and/or I/O device write commands determined and the manner in which, e.g., the timing, the I/O device commands are issued will vary.

In step 325, the I/O controller can send the I/O device read command, or commands, specifying the particular data block to be read to the I/O device. As noted, the I/O controller can generate the I/O device read command responsive to instructions and I/O device data block information received from the converter. The formatting of the read command can be performed by the I/O controller. Alternatively, the read command can be formatted by the converter and the formatted command passed to the I/O controller.

In step 330, the I/O controller can receive the data block specified by the I/O device read command from the I/O device. In step 335, the I/O controller can store the received data block within the buffer. In step 340, the I/O controller can notify the converter that the requested data block from the I/O device is available within the buffer.

In step 345, responsive to the notification from the I/O controller, the converter can correlate the processor address of the data unit to be written to the I/O device to corresponding locations within the retrieved data block stored within the buffer. For example, the converter can use the start data block, the start index, the ending data block, and the ending index to locate the portion of the retrieved data block to be overwritten with the data unit specified by the processor.

In step 350, the converter can update the data block by overwriting data at the location within the data block determined in step 345 with the data unit specified by the processor write request. For example, the converter can locate the start index within the start data block and overwrite data from the start index up to the end index of the end data block with the data unit. As noted, the start index of the start data block can correspond to the processor specified starting address of the data unit. The end index within the end data block can correspond to the processor specified ending address of the data unit.

In step 355, responsive to the data block being overwritten, at least in part, using the data unit, the I/O controller can send a write command to the I/O device to write the data block, as altered using the data unit, back to the I/O device. The write command to the I/O device can be part of the commands correlated to the processor write request in step 310. In step 360, the controller can write the updated data block to the I/O device. The updated data block can be written back to the original locations within the I/O device from which each respective data block was initially read in step 325.

The flowcharts in the figures illustrate the architecture, functionality, and operation of possible implementations of systems, methods and computer program products according to one or more embodiments disclosed within this specification. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to instantiate a circuit design configured to perform at least a portion of the functions described within this specification into a programmable IC. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A system for implementing a non-volatile I/O device based memory, the system comprising:
  an interface configured to receive a processor request specifying a data unit, wherein the data unit is specified using a processor address;
  an address-data converter coupled to the interface, wherein the address-data converter is configured to correlate the processor address of the data unit to a data block within the non-volatile I/O device; and
  an input/output (I/O) controller coupled to the address-data converter, wherein the I/O controller is configured to issue a non-volatile I/O device command specifying the data block to the non-volatile I/O device.

2. The system of claim 1, wherein the address-data converter is further configured to identify a processor command within the processor request and correlate the processor command to the non-volatile I/O device command.

3. The system of claim 2, wherein the address-data converter is further configured to correlate the processor address of the data unit to an offset within the data block.

4. The system of claim 1, wherein the address-data converter is further configured to determine a start data block within the non-volatile I/O device, a start index within the start data block, an end data block within the non-volatile I/O device, and an end index within the end block for the data unit.

5. The system of claim 1, wherein the I/O controller further comprises a buffer configured to:
  receive the data block from the non-volatile I/O device; and
  store the data block received from the non-volatile I/O device.

6. The system of claim 3, wherein the processor request is a processor read request and wherein the I/O controller is further configured to:
  issue a non-volatile I/O device read command specifying the data block to the non-volatile I/O device; and
  receive the data block from the non-volatile I/O device.

7. The system of claim 6, wherein the address-data converter is further configured to:
  extract data from the data block according to the offset; and
  return the extracted data to the processor as the data unit.

8. The system of claim 3, wherein the processor request comprises a processor write request and wherein the I/O controller is further configured to:
  issue a non-volatile I/O device read command specifying the data block to the non-volatile I/O device;
  receive the data block from the non-volatile I/O device; and
  update the data block by overwriting data within the data block with the specified data unit according to the offset.

9. The system of claim 8, wherein the I/O controller is further configured to issue a non-volatile I/O device write command to the non-volatile I/O device to write the updated data block to the non-volatile I/O device.

10. A method of using a non-volatile I/O device with a processor, the method comprising:
receiving a read request specifying a data unit, wherein the data unit is specified using a processor address;
correlating the processor address of the data unit to a data block stored within the non-volatile I/O device;
retrieving the data block from the non-volatile I/O device;
extracting data from the data block that correlates to the data unit; and
returning the extracted data to the processor as the data unit.

11. The method of claim 10, further comprising:
determining a processor read command from the read request; and
correlating the processor read command to a non-volatile I/O device read command.

12. The method of claim 10, wherein extracting data further comprises:
correlating the processor address of the data unit to an offset within the data block from which to extract the data.

13. The method of claim 10, further comprising:
receiving the data block from the non-volatile I/O device; and
responsive to receiving the data block, storing the data block within a buffer.

14. The method of claim 13, further comprising:
responsive to storing the data block within the buffer, generating a notification that the data block is available.

15. A method of using a non-volatile I/O device with a processor, the method comprising:
receiving, from a processor, a write request specifying a data unit to be written to the non-volatile I/O device, wherein the data unit is specified using a processor address;
correlating the processor address to a data block stored within the non-volatile I/O device;
retrieving the data block from the non-volatile I/O device;
updating the data block with the data unit specified by the write request; and
writing the updated data block to the non-volatile I/O device.

16. The method of claim 15, further comprising:
determining a processor write command from the write request; and
correlating the processor write command to a non-volatile I/O device read command and a non-volatile I/O device write command.

17. The method of claim 16, wherein retrieving the data block further comprises:
sending the non-volatile I/O device read command specifying the data block to the non-volatile I/O device;
receiving the data block from the non-volatile I/O device; and
responsive to receiving the data block, storing the data block within a buffer.

18. The system of claim 15, wherein updating the data block further comprises:
correlating the processor address to an offset within the data block; and
updating the data block by overwriting the data beginning at the offset within the data block with the data unit.

19. The method of claim 16, wherein writing the updated data block further comprises:
sending the non-volatile I/O device write command specifying the updated data block to the non-volatile I/O device.

20. The system of claim 15, further comprising:
providing an acknowledgement to the processor responsive to receiving the write request from the processor.

* * * * *